US011864307B2

(12) United States Patent
Byun et al.

(10) Patent No.: US 11,864,307 B2
(45) Date of Patent: Jan. 2, 2024

(54) PRINTED CIRCUIT BOARD

(71) Applicant: SAMSUNG ELECTRO-MECHANICS CO., LTD., Suwon-si (KR)

(72) Inventors: Dae Jung Byun, Suwon-si (KR); Jung Soo Kim, Suwon-si (KR); Sang Hyun Sim, Suwon-si (KR); Chang Min Ha, Suwon-si (KR); Tae Hong Min, Suwon-si (KR); Jin Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 258 days.

(21) Appl. No.: 17/124,893

(22) Filed: Dec. 17, 2020

(65) Prior Publication Data

US 2022/0095449 A1 Mar. 24, 2022

(30) Foreign Application Priority Data

Sep. 24, 2020 (KR) .................. 10-2020-0123777

(51) Int. Cl.
*H05K 1/02* (2006.01)
(52) U.S. Cl.
CPC .......... *H05K 1/0218* (2013.01); *H05K 1/024* (2013.01); *H05K 1/0256* (2013.01); *H05K 1/0298* (2013.01); *H05K 2201/0141* (2013.01)

(58) Field of Classification Search
CPC .............. H05K 1/0218; H05K 1/0298; H05K 2201/0141; H05K 1/024; H05K 3/4673; H05K 1/0256; H05K 3/28; H05K 3/4602
See application file for complete search history.

(56) References Cited

U.S. PATENT DOCUMENTS

| 2014/0145883 A1* | 5/2014 | Baks | ...................... H01L 23/66 343/700 MS |
| 2014/0204546 A1* | 7/2014 | Baker | .................... H05K 1/024 156/308.2 |
| 2015/0380848 A1* | 12/2015 | Kato | ................... H05K 3/4635 439/67 |

(Continued)

FOREIGN PATENT DOCUMENTS

| JP | 2016-34049 A | 3/2016 |
| JP | 2018-18935 A | 2/2018 |
| KR | 10-2003-0097028 A | 12/2003 |

*Primary Examiner* — Steven T Sawyer
(74) *Attorney, Agent, or Firm* — MORGAN, LEWIS & BOCKIUS LLP (57) ABSTRACT

A printed circuit board includes a first substrate portion including a plurality of first insulating layers, a plurality of first wiring layers respectively disposed on the plurality of first insulating layers, and a plurality of first adhesive layers respectively disposed between the plurality of first insulating layers to respectively cover the plurality of first wiring layers; and a second substrate portion disposed on the first substrate portion, and including a plurality of second insulating layers, a plurality of second wiring layers respectively disposed on the plurality of second insulating layers, and a plurality of second adhesive layers respectively disposed between the plurality of second insulating layers to respectively cover the plurality of second wiring layers.

21 Claims, 6 Drawing Sheets

(56) References Cited

U.S. PATENT DOCUMENTS

| | | | | |
|---|---|---|---|---|
| 2016/0020165 | A1* | 1/2016 | Kamgaing | H01L 23/49894 |
| | | | | 257/532 |
| 2018/0035534 | A1 | 2/2018 | Taniguchi et al. | |
| 2019/0027804 | A1* | 1/2019 | Kim | H01L 24/20 |
| 2019/0165449 | A1* | 5/2019 | Kim | H01L 23/66 |
| 2021/0189059 | A1* | 6/2021 | Tu | C08G 63/065 |

* cited by examiner

PRINTED CIRCUIT BOARD

CROSS-REFERENCE TO RELATED APPLICATION(S)

This application claims benefit of priority to Korean Patent Application No. 10-2020-0123777 filed on Sep. 24, 2020 in the Korean Intellectual Property Office, the disclosure of which is incorporated herein by reference in its entirety.

TECHNICAL FIELD

The present disclosure relates to a printed circuit board.

BACKGROUND

Due to the recent expansion of the 5G market, the need for printed circuit boards to reduce signal transmission loss in the high frequency region is increasing. In the meantime, it is advantageous to use materials having a low dissipation factor (Df) value as an insulating layer in order to reduce signal transmission loss in the high frequency region. However, since such materials are more expensive than conventional insulating materials, and raw material prices are relatively high, there is a problem of increasing product prices.

SUMMARY

An aspect of the present disclosure is to provide a printed circuit board for reducing signal transmission loss.

Another aspect of the present disclosure is to provide a printed circuit board for minimizing an increase in product price.

According to an aspect of the present disclosure, a printed circuit board includes a first substrate portion including a plurality of first insulating layers, a plurality of first wiring layers respectively disposed on the plurality of first insulating layers, and a plurality of first adhesive layers respectively disposed between the plurality of first insulating layers to respectively cover the plurality of first wiring layers; and a second substrate portion disposed on the first substrate portion, and including a plurality of second insulating layers, a plurality of second wiring layers respectively disposed on the plurality of second insulating layers, and a plurality of second adhesive layers respectively disposed between the plurality of second insulating layers to respectively cover the plurality of second wiring layers, wherein a dissipation factor of each adhesive layer of the plurality of first adhesive layers is lower than a dissipation factor of each adhesive layer of the plurality of second adhesive layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, the present disclosure will be described with reference to the accompanying drawings. Shape and size of the elements in the drawings may be exaggerated or reduced for clarity of description.

Electronics

Figure 1:
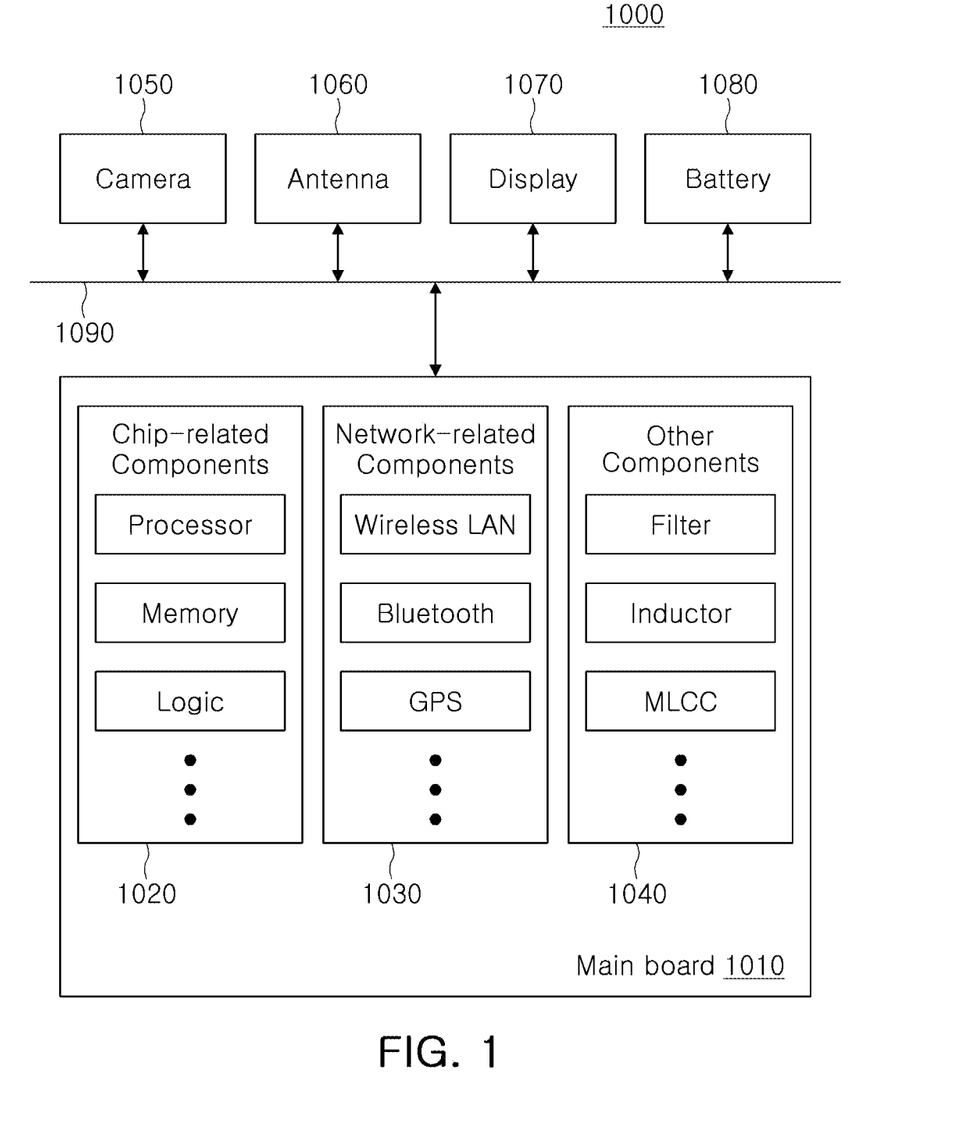
FIG. 1 is a block diagram schematically illustrating an example of an electronic device system.

FIG. 1 is a block diagram schematically illustrating an example of an electronic device system.

Referring to the drawings, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, but may also include other types of chip related components. In addition, the chip related components 1020 may be combined with each other. The chip related component 1020 may be in the form of a package including the above-described chip or an electronic component.

The network related components 1030 may include components compatible with or communicating using various protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with or communicating using a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
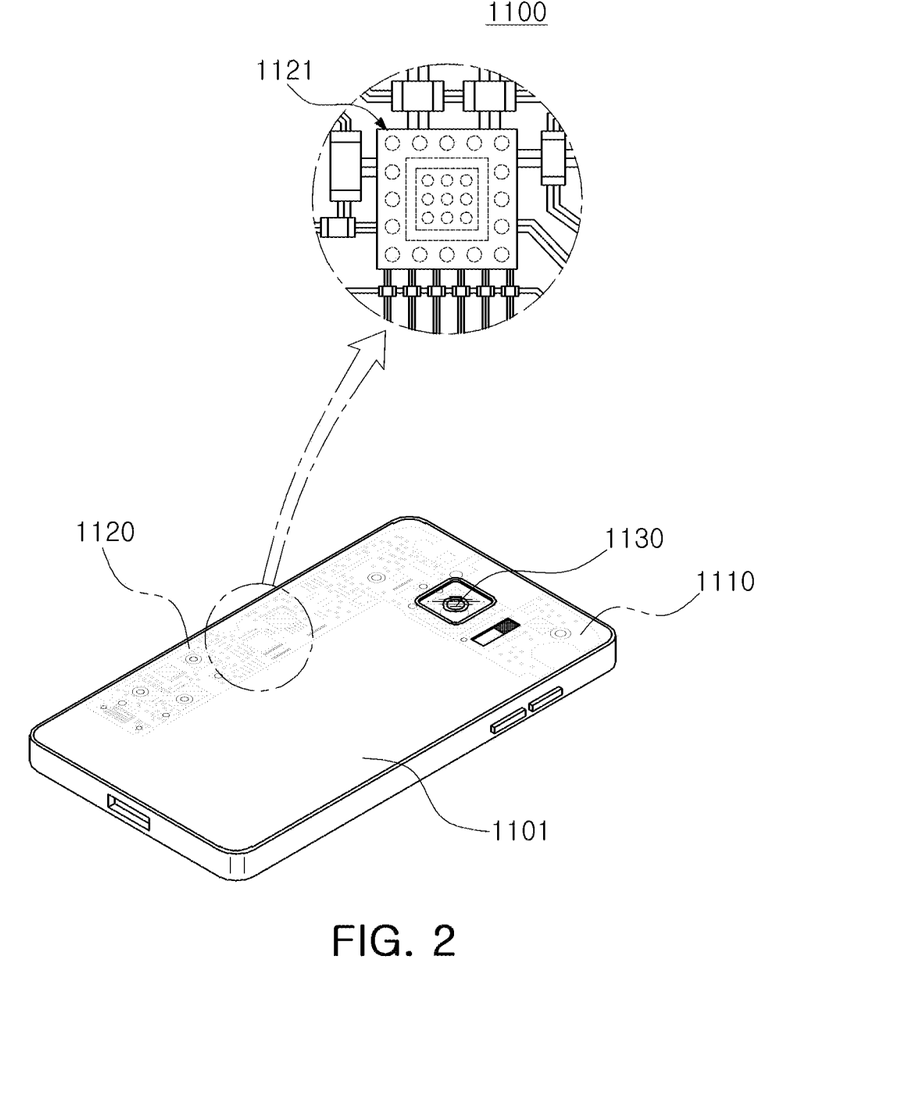
FIG. 2 is a perspective view schematically illustrating an example of an electronic device.

FIG. 2 is a perspective view schematically illustrating an example of an electronic device.

Referring to the drawings, an electronic device may be, for example, a smartphone 1100. A main board 1110 may be accommodated in a body 1101 of the smartphone 1100, and various electronic components 1120 may be physically and/or electrically connected to the main board 1110. In addition, other electronic components, such as a camera module 1130 and/or a speaker, which may or may not be physically and/or electrically connected to the main board 1110 may be accommodated therein. A portion of the electronic components 1120 may be the above-described chip related components, for example, an antenna module 1121, but are not limited thereto. The antenna module 1121 may be provided as a surface-mounted form in which a semiconductor chip or a passive component is mounted on a printed circuit board, but is not limited thereto. The electronic device is not necessarily limited to the smartphone 1100, but may be other electronic devices as described above.

Printed Circuit Board

Figure 3:
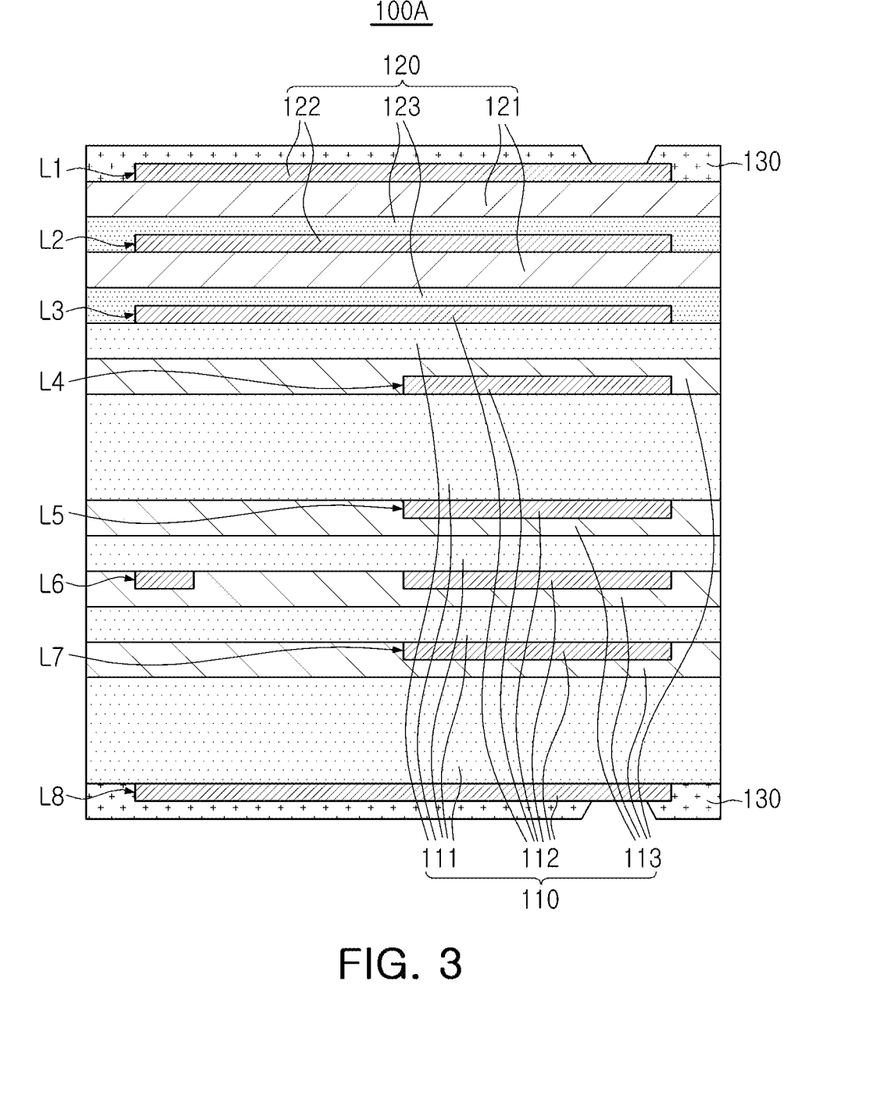
FIG. 3 is a cross-sectional view schematically illustrating an example of a printed circuit board according to the present disclosure.

FIG. 3 is a cross-sectional view schematically illustrating an example of a printed circuit board according to the present disclosure.

A printed circuit board 100A according to an example may be a multilayer printed circuit board. In this specification, the printed circuit board 100A will be described based on a multilayer printed circuit board including first to eighth layers L1 to L8, as illustrated in the drawings. However, the number of layers of a printed circuit board according to the present disclosure may be changed according to the design, and, in the number of layers of a printed circuit board 100A according to an example, the number of layers or a structure of a printed circuit board according to the present disclosure are not limited to the number of layers or a structure illustrated in the drawings. In this specification, each of the layers of the multilayer printed circuit board will be described based on a wiring layer, not on an insulating layer.

Referring to the drawings, a printed circuit board 100A according to an example may include a first substrate portion 110 and a second substrate portion 120, and may further include a protective layer 130.

The first substrate portion 110 may include a first insulating layer 111 and a first wiring layer 112, and may further include a first adhesive layer 113. In order to implement such a multilayer printed circuit board structure, the first insulating layer 111, the first wiring layer 112, and the first adhesive layer 113 may be provided as a plurality of first insulating layers 111, a plurality of first wiring layers 112, and a plurality of first adhesive layers 113, respectively. As necessary, the first insulating layer 111, the first wiring layer 112, and the first adhesive layer 113 may be provided as a single first insulating layer 111, a single first wiring layer 112, and a single first adhesive layer 113, respectively.

The second substrate portion 120 may include a second insulating layer 121 and a second wiring layer 122, and may further include a second adhesive layer 123. In order to implement such a multilayer printed circuit board structure, the second insulating layer 121, the second wiring layer 122, and the second adhesive layer 123 may be provided as a plurality of second insulating layers 121, a plurality of second wiring layers 122, and a plurality of second adhesive layers 123, respectively. As necessary, the second insulating layer 121, the second wiring layer 122, and the second adhesive layer 123 may be provided as a single second insulating layer 121, a single second wiring layer 122, and a single second adhesive layer 123, respectively.

Signal transmission loss may be affected by a surrounding environment of a signal pattern. In this case, an insulating material and an insulating distance may be included as a factor that may affect insertion loss, and therefore, usage of a material having a relatively low dissipation factor and securing the insulating distance may be required to reduce the insertion loss.

The first wiring layer 112 may be provided as a plurality of first wiring layers 112, and at least one first wiring layer 112 among the plurality of first wiring layers 112 may include a signal pattern. For example, a first wiring layer 112 disposed on a sixth layer L6 in the drawings may include a signal pattern, but may not be limited thereto.

In the present disclosure, the first insulating layer 111, which may be an insulating layer disposed close to the first wiring layer 112 including the signal pattern, e.g., which may be an insulating layer disposed within an insulating distance affecting insertion loss, may be formed of a material having a relatively low dissipation factor. The second insulating layer 121, which may be an insulating layer disposed relatively far from the first wiring layer 112 including the signal pattern, e.g., which may be an insulating layer that does not affect insertion loss, may be formed of a conventional insulating material. Therefore, a dissipation factor of the first insulating layer 111 may be lower than a dissipation factor of the second insulating layer 121.

In addition, the first adhesive layer 113, which may be a adhesive layer disposed close to the first wiring layer 112 including the signal pattern, e.g., which may be a adhesive layer disposed within an insulating distance affecting insertion loss, may be formed of a adhesive material having a relatively low dissipation factor. The second adhesive layer 123, which may be a adhesive layer disposed relatively far from the first wiring layer 112 including the signal pattern, e.g., which may be a adhesive layer that does not affect insertion loss, may be formed of a conventional adhesive material. Therefore, a dissipation factor of the first adhesive layer 113 may be lower than a dissipation factor of the second adhesive layer 123.

As described above, the printed circuit board 100A according to the present disclosure may introduce a material having a relatively low dissipation factor to an insulating layer and/or an adhesive layer, affecting insertion loss, to minimize signal transmission loss. In addition, a material having a relatively low dissipation factor may be selectively introduced only in a necessary area, and an insulating layer and/or an adhesive layer, not affecting insertion loss may be formed with a conventional insulating material, to minimize an increase in product price.

Hereinafter, components of a printed circuit board 100A according to an example will be described in more detail.

The first substrate portion 110 may include a first insulating layer 111 and a first wiring layer 112, and may further include a first adhesive layer 113. The first insulating layer 111, the first wiring layer 112, and the first adhesive layer 113 may be provided as a plurality of first insulating layers 111, a plurality of first wiring layers 112, and a plurality of first adhesive layers 113, respectively.

The plurality of first wiring layers 112 may be respectively disposed on the plurality of first insulating layers 111, and the plurality of first adhesive layers 113 may be respectively disposed between the plurality of first insulating layers 111 to respectively cover the plurality of first wiring layers 112.

An insulating material may be used as a material for forming the first insulating layer 111. In this case, in terms of signal transmission loss, a dissipation factor of the first insulating layer 111 may be lower than a dissipation factor of the second insulating layer 121. When the first insulating layer 111 and the second insulating layer 121 are respectively provided as a plurality of first insulating layers 111 and a plurality of second insulating layers 121, a dissipation factor of each adhesive layer of the plurality of first insulating layers 111 may be lower than a dissipation factor of each adhesive layer of the plurality of second insulating layers 121. In this respect, a material having a relatively low dissipation factor may be used as a material for forming the first insulating layer 111, and, for example, a liquid crystal polymer (LCP), polytetrafluoroethylene (PTFE), polyphenylene sulfide (PPS), polyphenylene ether (PPE), polyimide (PI), cyclo olefin polymer (COP), polyether ether ketone (PEEK), or the like may be used.

The number of the first insulating layers 111 is not particularly limited, and when the first insulating layer 111 is provided as a plurality of first insulating layers 111, materials, thicknesses, or the like of the plurality of first insulating layers 111 may be the same as or different from each other.

When the printed circuit board has a core substrate structure, the first insulating layer 111 may include a core layer having a thick thickness. In one example, the core layer may have a thickness greater than a thickness of each of other insulating layers and a thickness of each of the adhesive layer. In this case, a portion of the first wiring layers 112 may be disposed on one side of the core layer, and remaining portions of the first wiring layers 112 may be disposed on the other side of the core layer, opposite to the one side of the core layer. For example, as illustrated in the drawings, a first insulating layer 111 disposed between a fourth layer L4 and a fifth layer L5 may be a core layer, a first wiring layer 112 disposed on a third layer L3 to the fourth layer L4 may be disposed on one side of the core layer, and a first wiring layer 112 disposed on fifth to eighth layers L5 to L8 may be disposed on the other side of the core layer. Further, first wiring layers 112 disposed on the fourth and fifth layers L4 and L5 may be disposed on both surfaces of the core layer.

The second substrate portion 120 may be disposed on the one side of the core layer, and at least one first wiring layer 112 among the first wiring layers 112 disposed on the other side of the core layer may include a signal pattern. In this case, a core layer disposed close to the first wiring layer 112 including the signal pattern may be a first insulating layer 111 having a relatively low dissipation factor, and an insulating layer disposed away from the first wiring layer 112 including the signal pattern may be a second insulating layer 121 having a relatively high dissipation factor.

The first wiring layer 112 may perform various functions according to a design of the respective layers. For example, the first wiring layer 112 may include a ground pattern, a power pattern, a signal pattern, or the like. In this case, the signal pattern may include patterns for carrying various signals, except for the ground pattern, the power pattern, and the like, for example, an antenna signal, a data signal, or the like. Each of these patterns may include a line pattern, a plane pattern, and/or a pad pattern.

From a similar viewpoint, when the first wiring layer 112 is provided as a plurality of first wiring layers 112, at least one first wiring layer 112 among the plurality of first wiring layers 112 may include a first wiring layer 112 including a signal pattern. In addition, at least one other first wiring layer 112 among the plurality of first wiring layers 112 may further include a first wiring layer 112 including a ground pattern.

In this case, the first wiring layer 112 including the ground pattern may be disposed on a different level from the first wiring layer 112 including the signal pattern. For example, the first wiring layer 112 including the signal pattern may be disposed on the sixth layer L6, and the first wiring layer 112 including the ground pattern may be disposed on the third layer L3.

The first wiring layer 112 including the ground pattern may be provided as a plurality of first wiring layers 112. The first wiring layer 112 including the ground pattern may be disposed on both sides of the first wiring layer 112 including the signal pattern. For example, the first wiring layer 112 including the signal pattern may be disposed on the sixth layer L6, and the first wiring layer 112 including the ground pattern may be disposed on the third layer L3 and the eighth layer L8.

However, an arrangement of the signal pattern, the ground pattern, or the like may be changed according to a design.

A conductive material may be used as a material for forming the first wiring layer 112, and, as a non-limiting example thereof, copper (Cu), aluminum (Al), silver (Ag), tin (Sn), gold (Au), nickel (Ni), lead (Pb), titanium (Ti), or alloys thereof, or the like may be used. The first wiring layer 112 may be formed by a known plating process, and thus may include a seed layer that may be an electroless plating layer and an electroplating layer formed on the basis of the seed layer.

Each first wiring layer of the plurality of first wiring layers 112 disposed on different layers may be connected to each other through a via passing through the first insulating layer 111. As a material for forming the via, the same material as the material for forming the first wiring layer 112 may be used, and the via may be integrally formed with the first wiring layer 112.

As described above, each adhesive layer of the plurality of first adhesive layers 113 may be disposed between each adhesive layer of the plurality of first insulating layers 111 to cover each first wiring layer of the plurality of first wiring layers 112. Through this, the first adhesive layer 113 may be disposed between the first insulating layers 111, and may serve to attach the first insulating layers 111 to each other.

As a material for forming the first adhesive layer 113, a material having adhesive properties that may be used for a printed circuit board may be used without any limitation. For example, the first adhesive layer 113 may be a bonding sheet.

As necessary, the first adhesive layer 113 may use a material having a relatively low dissipation factor, as a material for forming the first adhesive layer 113 in terms of signal transmission loss, and, may use, for example, a bonding sheet that may minimize signal transmission loss. Therefore, a dissipation factor of the first adhesive layer 113 may be lower than a dissipation factor of the second adhesive layer 123. When the first adhesive layer 113 and the second adhesive layer 123 are provided as a plurality of first adhesive layers 113 and a plurality of second adhesive layers 123, respectively, a dissipation factor of each adhesive layer of the plurality of first adhesive layers 113 may be lower than a dissipation factor of each adhesive layer of the plurality of second adhesive layers 123.

A dissipation factor of the first adhesive layer 113 may be lower than a dissipation factor of the second insulating layer 121. A dissipation factor of the first adhesive layer 113 may be higher or lower than a dissipation factor of the first insulating layer 111. Alternatively, a dissipation factor of the first adhesive layer 113 may be the same as a dissipation factor of the first insulating layer 111.

The second substrate portion 120 may include a second insulating layer 121 and a second wiring layer 122, and may further include a second adhesive layer 113. The second insulating layer 121, the second wiring layer 122, and the second adhesive layer 123 may be provided as a plurality of second insulating layers 121, a plurality of second wiring layers 122, and a plurality of second adhesive layers 123, respectively.

The plurality of second wiring layers 122 may be respectively disposed on the plurality of second insulating layers 121, and the plurality of second adhesive layers 123 may be respectively disposed between each adhesive layer of the plurality of second insulating layers 121 to respectively cover the plurality of second wiring layers 122.

As a material for forming the second insulating layer 121, a material having insulating properties may be used without limitation. For example, as a material for forming the second insulating layer 121, a material including a thermosetting resin such as an epoxy resin, a thermoplastic resin such as polyimide, or a reinforcing material such as a glass fiber, a glass cloth, or a glass fabric and/or an inorganic filler, together with these, for example, a prepreg, Ajinomoto build-up film (ABF), photoimageable dielectric (PID), or the like may be used. However, the present disclosure is not limited thereto, and as necessary, the same material as the material for forming the first insulating layer 111 may be used as a material for forming the second insulating layer 121.

The number of the second insulating layers 121 is not particularly limited, and when the second insulating layer 121 is provided as a plurality of second insulating layers 121, materials, thicknesses, or the like of the plurality of second insulating layers 121 may be the same as or different from each other.

The second wiring layer 122 may perform various functions according to a design of the respective layers. For example, the second wiring layer 122 may include a ground pattern, a power pattern, a signal pattern, or the like. In this case, the signal pattern may include patterns for carrying various signals, except for the ground pattern, the power pattern, and the like, for example, an antenna signal, a data signal, or the like. Each of these patterns may include a line pattern, a plane pattern, and/or a pad pattern.

A conductive material may be used as a material for forming the second wiring layer 122, and, as a non-limiting example thereof, copper (Cu), aluminum (Al), silver (Ag), tin (Sn), gold (Au), nickel (Ni), lead (Pb), titanium (Ti), or alloys thereof, or the like may be used. The second wiring layer 122 may be formed by a known plating process, and thus may include a seed layer that may be an electroless plating layer and an electroplating layer formed on the basis of the seed layer.

Each second wiring layer of the plurality of second wiring layers 122 disposed on different layers may be connected to each other through a via passing through the second insulating layer 121. As a material for forming the via, the same material as the material for forming the second wiring layer 122 may be used, and the via may be integrally formed with the second wiring layer 122.

As described above, each adhesive layer of the plurality of second adhesive layers 123 may be disposed between each adhesive layer of the plurality of second insulating layers 121 to cover each second wiring layer of the plurality of second wiring layers 122. Through this, the second adhesive layer 123 may be disposed between the second insulating layers 121, and may serve to attach the second insulating layers 121 to each other.

A lowermost second adhesive layer 123 among the plurality of second adhesive layers 123 may be disposed between an uppermost first insulating layer 111 among the plurality of first insulating layers 111 and a lowermost second insulating layer 121 among the plurality of second insulation layers 121, to cover an uppermost first wiring layer 112 among the plurality of first wiring layers 112. In this case, the expressions of "uppermost" and "lowermost" are described with reference to the drawings. The uppermost first insulating layer 111 among the plurality of first insulating layers 111 may refer to a first insulating layer 111 disposed closest to a second insulating layer 121, among the plurality of first insulating layers 111, and the lowermost second insulating layer 121 among the plurality of second insulating layers 121 may refer to a second insulating layer 121 disposed closest to a first insulating layer 111, among the plurality of second insulating layers 121.

As a material for forming the second adhesive layer 123, a material having adhesive properties that may be used for a printed circuit board may be used without any limitation. For example, the second adhesive layer 123 may be a bonding sheet.

The protective layer 130 may be respectively disposed on the first substrate portion 110 and the second substrate portion 120, and may respectively have an opening exposing at least a portion of the first wiring layer 112 and an opening exposing at least a portion of the second wiring layer 122. In this case, the first wiring layer 112 and the second wiring layer 122 respectively exposed through the openings may be an outermost first wiring layer 112 among the plurality of first wiring layers 112 and an outermost second wiring layer 122 among the plurality of second wiring layers 122, respectively.

The protective layer 130 may be an Ajinomoto build-up film (ABF) layer, or may be a solder resist (SR) layer. However, the present disclosure is not limited thereto, and a known insulating material may be used as a material for forming the protective layer 130.

Figure 4:
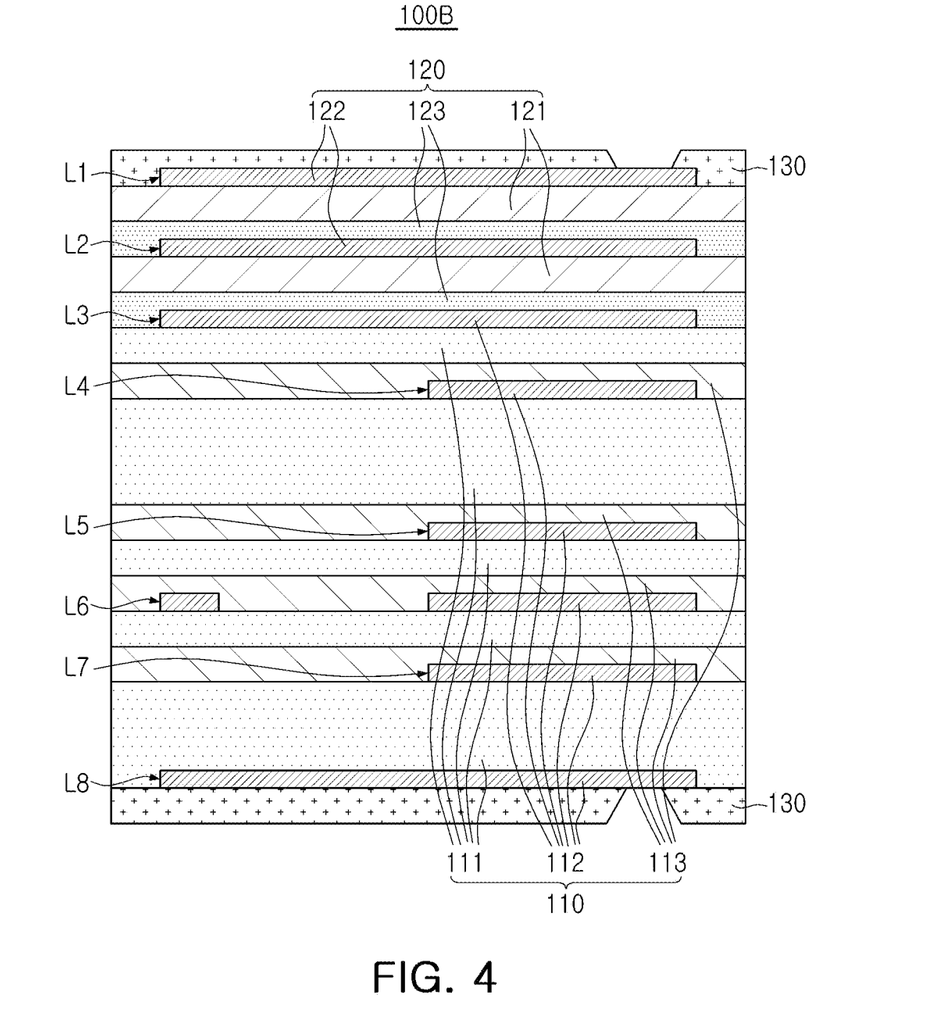
FIG. 4 is a cross-sectional view schematically illustrating another example of a printed circuit board according to the present disclosure.

FIG. 4 is a cross-sectional view schematically illustrating another example of a printed circuit board according to the present disclosure.

Referring to the drawings, a printed circuit board 100B according to another example is different from a printed circuit board 100A according to an example, in view of the fact that a first wiring layer 112 is buried in a first insulating layer 111.

A printed circuit board 100B according to another example may be only for illustrating that a printed circuit board according to the present disclosure may have various structures, and may not be intended to limit a configuration of the present disclosure.

Since other aspects may be the same as those described above in a description of a printed circuit board 100A according to an example, detailed descriptions thereof will be omitted.

Figure 5:
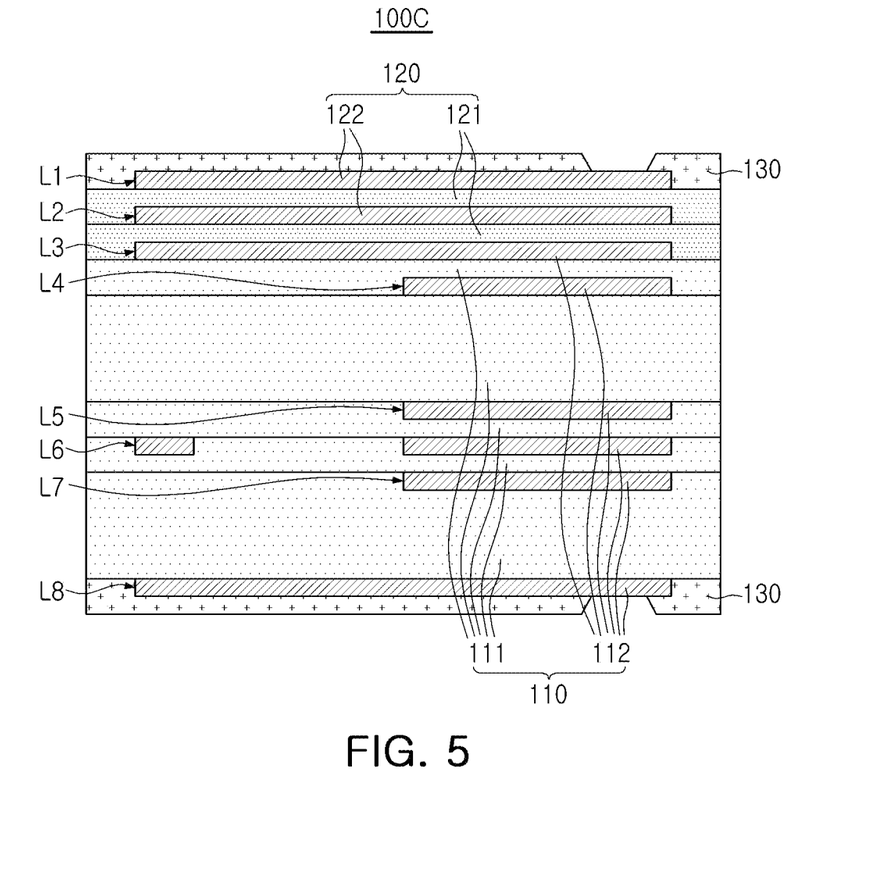
FIG. 5 is a cross-sectional view schematically illustrating another example of a printed circuit board according to the present disclosure.

FIG. 5 is a cross-sectional view schematically illustrating another example of a printed circuit board according to the present disclosure.

Referring to the drawings, a printed circuit board 100C according to another example is different from a printed circuit board 100A according to an example, in view of the fact that a first adhesive layer 113 and a second adhesive layer 123 are not included.

A printed circuit board 100C according to another example may be only for illustrating that a printed circuit board according to the present disclosure may have various structures, and may not be intended to limit a configuration of the present disclosure.

Alternatively, a printed circuit board 100C according to another example may include anyone of a first adhesive layer 113 and a second adhesive layer 123. For example, a printed circuit board 100C according to another example may include only a first adhesive layer 113 disposed between first insulating layers 111, and may not include a second adhesive layer 123. Alternatively, a printed circuit board 100C according to another example may include only a second adhesive layer 123 disposed between second insulating layers 121, and may not include a first adhesive layer 113.

Since other aspects may be the same as those described above in a description of a printed circuit board 100A according to an example, detailed descriptions thereof will be omitted.

Figure 6:
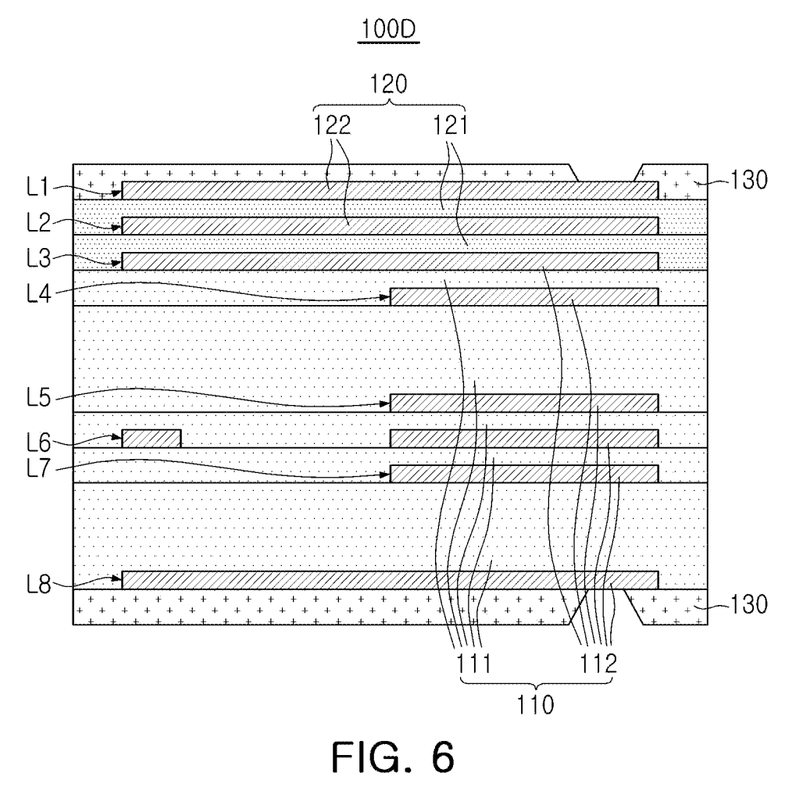
FIG. 6 is a cross-sectional view schematically illustrating another example of a printed circuit board according to the present disclosure.

FIG. 6 is a cross-sectional view schematically illustrating another example of a printed circuit board according to the present disclosure.

Referring to the drawings, a printed circuit board 100D according to another example is different from a printed circuit board 100C according to an example, in view of the fact that a first wiring layer 112 is buried in a first insulating layer 111.

A printed circuit board 100D according to another example may be only for illustrating that a printed circuit board according to the present disclosure may have various structures, and may not be intended to limit a configuration of the present disclosure.

Since other aspects may be the same as those described above in descriptions of a printed circuit board 100A according to an example to a printed circuit board 100C according to another example, detailed descriptions thereof will be omitted.

As used herein, the term "connect" or "connection" in this specification may not be only a direct connection, but also a concept including an indirect connection. In addition, the term "electrically connected" or "electrical connection" in this specification is a concept including both a physical connection and a physical non-connection.

In this specification, the expressions of "first," second," etc. in this specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The expression "example" used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in the present disclosure are used only to illustrate various examples and are not intended to limit the present inventive concept. Singular expressions include plural expressions unless the context clearly dictates otherwise.

As one of various effects of the present disclosure, a printed circuit board for reducing signal transmission loss may be provided.

As another effect of various effects of the present disclosure, a printed circuit board for minimizing an increase in product price may be provided.

While example embodiments have been illustrated and described above, it will be apparent to those skilled in the art that modifications and variations could be made without departing from the scope of the present disclosure as defined by the appended claims.

What is claimed is:

1. A printed circuit board comprising:
   a first substrate portion including a plurality of first insulating layers, a plurality of first wiring layers respectively disposed on the plurality of first insulating layers, and a plurality of first adhesive layers respectively disposed between the plurality of first insulating layers to respectively cover the plurality of first wiring layers; and
   a second substrate portion disposed on the first substrate portion, and including a plurality of second insulating layers, a plurality of second wiring layers respectively disposed on the plurality of second insulating layers, and a plurality of second adhesive layers respectively disposed between the plurality of second insulating layers to respectively cover the plurality of second wiring layers,
   wherein a dissipation factor of each adhesive layer of the plurality of first adhesive layers is lower than a dissipation factor of each adhesive layer of the plurality of second adhesive layers,
   the plurality of first wiring layers excluding a lowermost wiring layer are respectively embedded in the plurality of first adhesive layers such that side surfaces of the plurality of first wiring layers excluding the lowermost wiring layer are respectively covered by the plurality of first adhesive layers, and one of the plurality of second wiring layers is embedded in one of the plurality of second adhesive layers such that side surfaces of the one of the plurality of second wiring layers are covered by the one of the plurality of second adhesive layers.

2. The printed circuit board of claim 1, wherein a dissipation factor of each insulating layer of the plurality of first insulating layers is lower than a dissipation factor of each insulating layer of the plurality of second insulating layers.

3. The printed circuit board of claim 2, wherein a material for forming each insulating layer of the plurality of first insulating layers comprises a liquid crystal polymer.

4. The printed circuit board of claim 1, wherein a lowermost second adhesive layer among the plurality of second adhesive layers is disposed between an uppermost first insulating layer among the plurality of first insulating layers and a lowermost second insulating layer among the plurality of second insulation layers, to cover an uppermost first wiring layer among the plurality of first wiring layers.

5. The printed circuit board of claim 1, wherein at least one first wiring layer among the plurality of first wiring layers comprises a signal pattern.

6. The printed circuit board of claim 5, wherein at least one other first wiring layer among the plurality of first wiring layers comprises a ground pattern,
wherein the at least one other first wiring layer including the ground pattern is disposed on a different level from the at least one first wiring layer including the signal pattern.

7. The printed circuit board of claim 6, wherein the at least one other first wiring layer including the ground pattern is disposed on both sides of the at least one first wiring layer including the signal pattern.

8. The printed circuit board of claim 1, wherein the plurality of first insulating layers comprise a core layer,
a portion of the plurality of first wiring layers is disposed on one side of the core layer, and
remaining portions of the plurality of first wiring layers are disposed on the other side of the core layer, opposite to the one side of the core layer.

9. The printed circuit board of claim 8, wherein the second substrate portion is disposed on the one side of the core layer, and
at least one first wiring layer among the remaining portions of the plurality of first wiring layers disposed on the other side of the core layer comprises a signal pattern.

10. A printed circuit board comprising:
a first substrate portion including a plurality of first insulating layers, a plurality of first wiring layers respectively disposed on the plurality of first insulating layers, and a plurality of first adhesive layers respectively disposed between the plurality of first insulating layers to respectively cover the plurality of first wiring layers; and
a second substrate portion disposed on the first substrate portion, and including a plurality of second insulating layers, a plurality of second wiring layers respectively disposed on the plurality of second insulating layers, and a plurality of second adhesive layers respectively disposed between the plurality of second insulating layers to respectively cover the plurality of second wiring layers,
wherein a dissipation factor of each adhesive layer of the plurality of first adhesive layers is lower than a dissipation factor of each adhesive layer of the plurality of second adhesive layers,
the plurality of first insulating layers comprise a core layer,
a portion of the plurality of first wiring layers is disposed on one side of the core layer,
remaining portions of the plurality of first wiring layers are disposed on the other side of the core layer, opposite to the one side of the core layer, and
two of the plurality of first wiring layers are respectively disposed on opposing surfaces of the core layer.

11. The printed circuit board of claim 8, wherein one of the plurality of first wiring layers is disposed on one surface of the core layer, and another of the plurality of first wiring layers is embedded in the core layer and exposed from another surface of the core layer opposing the one surface.

12. The printed circuit board of claim 8, wherein among the plurality of first wiring layers and the plurality of second wiring layers, only one wiring layer of the plurality of first wiring layers is in contact with the core layer.

13. The printed circuit board of claim 8, wherein the core layer has a thickness greater than a thickness of each of remaining insulating layers of the plurality of first insulating layers, a thickness of each of the plurality of second insulating layers, a thickness of each of the plurality of first adhesive layers, and a thickness of each of the plurality of second adhesive layers.

14. The printed circuit board of claim 1, further comprising a protective layer respectively disposed on the first substrate portion and the second substrate portion, and respectively having an opening exposing at least a portion of an outermost first wiring layer among the plurality of first wiring layers and an opening exposing at least a portion of an outermost second wiring layer among the plurality of second wiring layers.

15. A printed circuit board comprising:
a first substrate portion including a plurality of first insulating layers, a plurality of first wiring layers respectively disposed on the plurality of first insulating layers, and a plurality of first adhesive layers respectively disposed between the plurality of first insulating layers to respectively cover the plurality of first wiring layers; and
a second substrate portion disposed on the first substrate portion, and including a plurality of second insulating layers, a plurality of second wiring layers respectively disposed on the plurality of second insulating layers, and a plurality of second adhesive layers respectively disposed between the plurality of second insulating layers to respectively cover the plurality of second wiring layers,
wherein a dissipation factor of each insulating layer of the plurality of first insulating layers is lower than a dissipation factor of each insulating layer of the plurality of second insulating layers,
the plurality of first wiring layers excluding a lowermost wiring layer are respectively embedded in the plurality of first adhesive layers such that side surfaces of the plurality of first wiring layers excluding the lowermost wiring layer are respectively covered by the plurality of first adhesive layers, and
one of the plurality of second wiring layers is embedded in one of the plurality of second adhesive layers such that side surfaces of the one of the plurality of second wiring layers are covered by the one of the plurality of second adhesive layers.

16. The printed circuit board of claim 15, wherein the first substrate portion is disposed only on one side of the second substrate portion.

17. The printed circuit board of claim 15, wherein each of the plurality of first adhesive layers includes a material different from a material included in each of the plurality of first insulating layers.

18. The printed circuit board of claim 1, wherein the first substrate portion is disposed only on one side of the second substrate portion.

19. The printed circuit board of claim 1, wherein each of the plurality of first adhesive layers includes a material different from a material included in each of the plurality of first insulating layers.

20. The printed circuit board of claim 15, wherein the second substrate portion is disposed on the first substrate portion in one direction,
- one of the plurality of first wiring layers protrudes in a direction opposite to the one direction on one of the plurality of first insulating layer to be embedded in one of the plurality of first adhesive layers, and
- the one of the plurality of second wiring layers protrudes in the one direction on one of the plurality of second insulating layer to be embedded in the one of the plurality of second adhesive layers.

21. The printed circuit board of claim 1, wherein the second substrate portion is disposed on the first substrate portion in one direction,
- one of the plurality of first wiring layers protrudes in a direction opposite to the one direction on one of the plurality of first insulating layer to be embedded in one of the plurality of first adhesive layers, and
- the one of the plurality of second wiring layers protrudes in the one direction on one of the plurality of second insulating layer to be embedded in the one of the plurality of second adhesive layers.

* * * * *